(12) United States Patent
Tsai et al.

(10) Patent No.: US 11,758,689 B2
(45) Date of Patent: Sep. 12, 2023

(54) VAPOR CHAMBER EMBEDDED REMOTE HEATSINK

(71) Applicant: Cisco Technology, Inc., San Jose, CA (US)

(72) Inventors: Yaotsan Tsai, San Jose, CA (US); Yongguo Chen, Shanghai (CN); Hua Yang, Tracy, CA (US); Vic Hong Chia, Sunnyvale, CA (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 32 days.

(21) Appl. No.: 17/242,722

(22) Filed: Apr. 28, 2021

(65) Prior Publication Data

US 2022/0354019 A1    Nov. 3, 2022

(51) Int. Cl.
*H05K 7/20*    (2006.01)

(52) U.S. Cl.
CPC ..... *H05K 7/20336* (2013.01); *H05K 7/20509* (2013.01)

(58) Field of Classification Search
CPC ............ H05K 7/20336; H05K 7/20509; H01L 23/427; F28D 15/0275
See application file for complete search history.

(56) References Cited

U.S. PATENT DOCUMENTS

| | | | |
|---|---|---|---|
| 2006/0060952 A1* | 3/2006 | Yuan | H01L 23/4334 257/E23.101 |
| 2011/0024086 A1 | 2/2011 | Tan et al. | |
| 2017/0338167 A1 | 11/2017 | Bozorgi | |
| 2018/0286844 A1 | 10/2018 | Dogruoz et al. | |
| 2019/0027424 A1 | 1/2019 | Mira et al. | |
| 2019/0348345 A1* | 11/2019 | Parida | H01L 25/18 |
| 2020/0022282 A1 | 1/2020 | Gaskill | |
| 2020/0191494 A1* | 6/2020 | Ito | H05K 7/20409 |
| 2020/0355444 A1* | 11/2020 | Chen | F28D 15/0283 |
| 2021/0327785 A1* | 10/2021 | Lin | F28D 15/04 |

OTHER PUBLICATIONS

Marc, "Heat Pipes & Vapor Chambers—What's the Difference?", Celsia, Oct. 27, 2019, 49 pages.
Ralph L. Webb et al., "Remote Heat Sink Concept for High Power Heat Rejection", IEEE Transactions on Components and Packaging Technologies, vol. 25, No. 4, Dec. 2002, 7 pages.

* cited by examiner

*Primary Examiner* — Mukundbhai G Patel
(74) *Attorney, Agent, or Firm* — Edell, Shapiro & Finnan, LLC

(57) ABSTRACT

Presented herein is a cold plate assembly including a sub-plate and a vapor chamber for use as part of a remote fin cooling system for an electronic device. The sub-plate includes a first surface, a second surface, and a plurality of pipes. The vapor chamber includes a first wall and a second wall opposite the first wall. The first wall and the second wall define an interior cavity having a first depth for one or more first portions of the vapor chamber and a second depth for one or more second portions of the vapor chamber. The second surface of the sub-plate is attached to the first wall of the vapor chamber.

20 Claims, 6 Drawing Sheets

US 11,758,689 B2

VAPOR CHAMBER EMBEDDED REMOTE HEATSINK

TECHNICAL FIELD

The present disclosure relates to cooling arrangements for electronic devices.

BACKGROUND

As power consumption by application-specific integrated circuits (ASICs) and central processing units (CPU) increases due to faster communication and computing requirements, the heat generated by the ASICs/CPUs increases as well. This results in an increased demand for cooling via a heatsink thermally coupled to the ASIC/CPU. The generated heat may be conducted through the limited area of the ASIC/CPU to the heatsink, and the heat can be unevenly distributed along the heatsink. Consequently, the heatsink may not adequately cool the ASIC/CPU, potentially causing the ASIC/CPU to overheat.

DESCRIPTION OF EXAMPLE EMBODIMENTS

Overview

Presented herein is a cold plate assembly including a sub-plate and a vapor chamber for use as part of a remote fin cooling system for an electronic device. The sub-plate includes a first surface, a second surface, and a plurality of pipes. The vapor chamber includes a first wall and a second wall opposite the first wall. The first wall and the second wall define an interior cavity having a first depth for one or more first portions of the vapor chamber and a second depth for one or more second portions of the vapor chamber. The second surface of the sub-plate is attached to the first wall of the vapor chamber.

Example Embodiments

Figure 1:
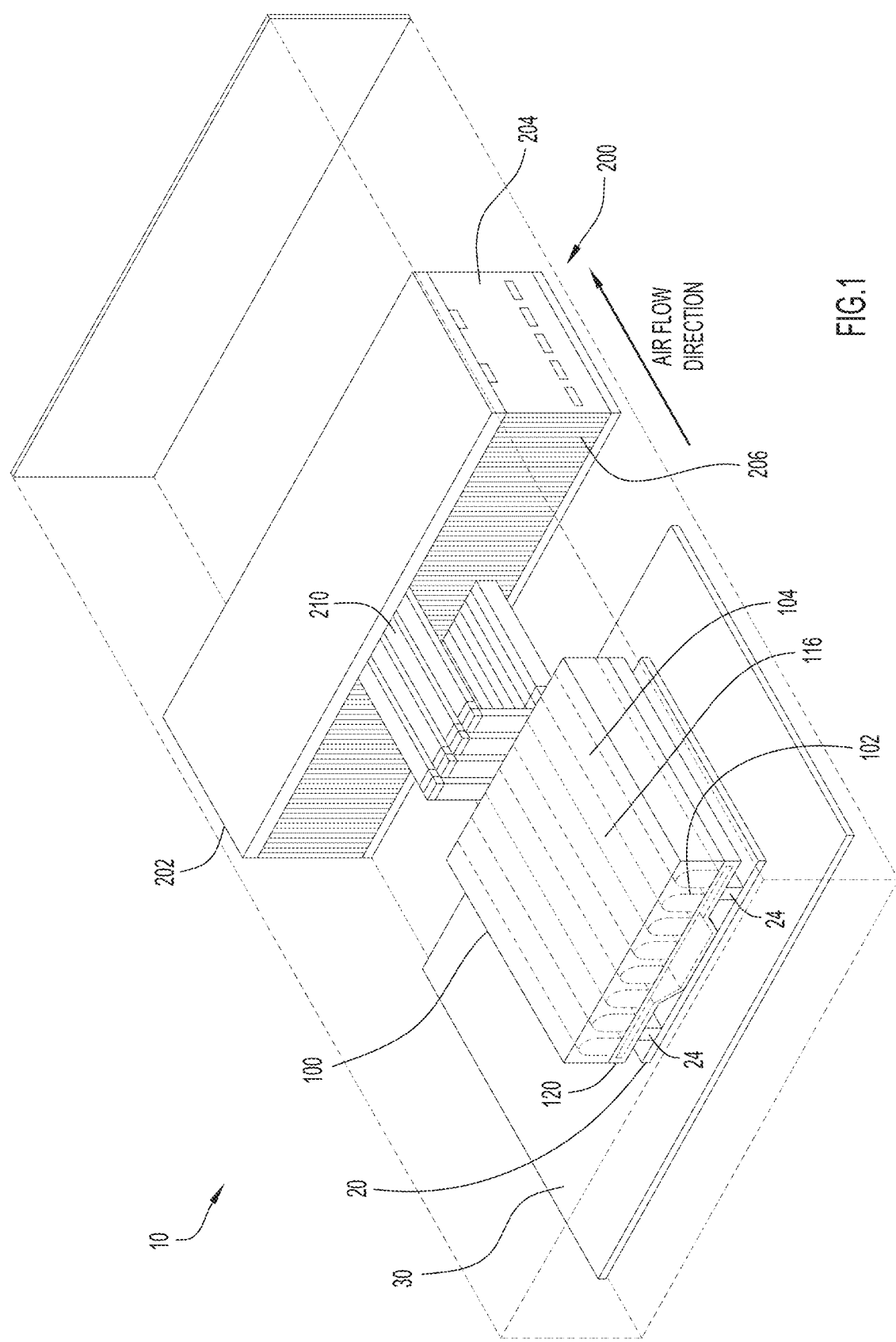
FIG. 1 is a perspective view of a cooling system having a remote heatsink coupled to a heat source, according to an example embodiment.

With reference made to FIG. 1, a cooling system 10 for dissipating heat generated by a heat source 20 disposed on a printed circuit board (PCB) 30 is illustrated. The heat source 20 may be an ASIC/CPU/processor/chip or other circuitry coupled the PCB 30. The cooling system includes a cold plate assembly 100 having a front end 102 and a back end 104. The cold plate assembly is fluidly coupled to a remote heatsink 200 via fluid carrying conduits 210. The remote heatsink 200 includes lateral ends 202 and 204 and a plurality of fins 206 thermally coupled to the fluid carrying conduits 210.

The cold plate assembly 100 is thermally coupled to the heat source 20 and the fluid carrying conduits 210 may be heat pipes. The fluid carrying conduits 210 extend into and towards the lateral ends 202, 204 of the remote heatsink 200. A cooling fluid in the fluid carrying conduits 210 transfers heat from the cold plate assembly 100 through the conduits 210 to the remote heatsink 200.

During operation, heat generated by the heat source 20 is transferred to the cold plate assembly 100 and the cooling fluid flowing therethrough. The cooling fluid flows through the fluid carrying conduits 210 to the remote heatsink 200. The heat is transferred from the cooling fluid to fins 206 disposed in the remote heatsink 200. Air flows through the remote heatsink 200 to cool the fins 206. That is, the conduits 210 transfer the heat from the cooling fluid flowing through the cooling system 10 to the fins 206, and the fins 206 transfer the heat to the air flowing through the remote heatsink 200. The cooling fluid, now cooled by the remote heatsink 200, flows back through the fluid carrying conduits 210 to the cold plate assembly 100 where the cycle repeats. The flow of cooling fluid between the cold plate assembly 100 and the remote heatsink 200 may be driven by convection. In some implementations, the cooling system 10 may include a pump to circulate the cooling fluid through the conduits 210.

Figure 2:
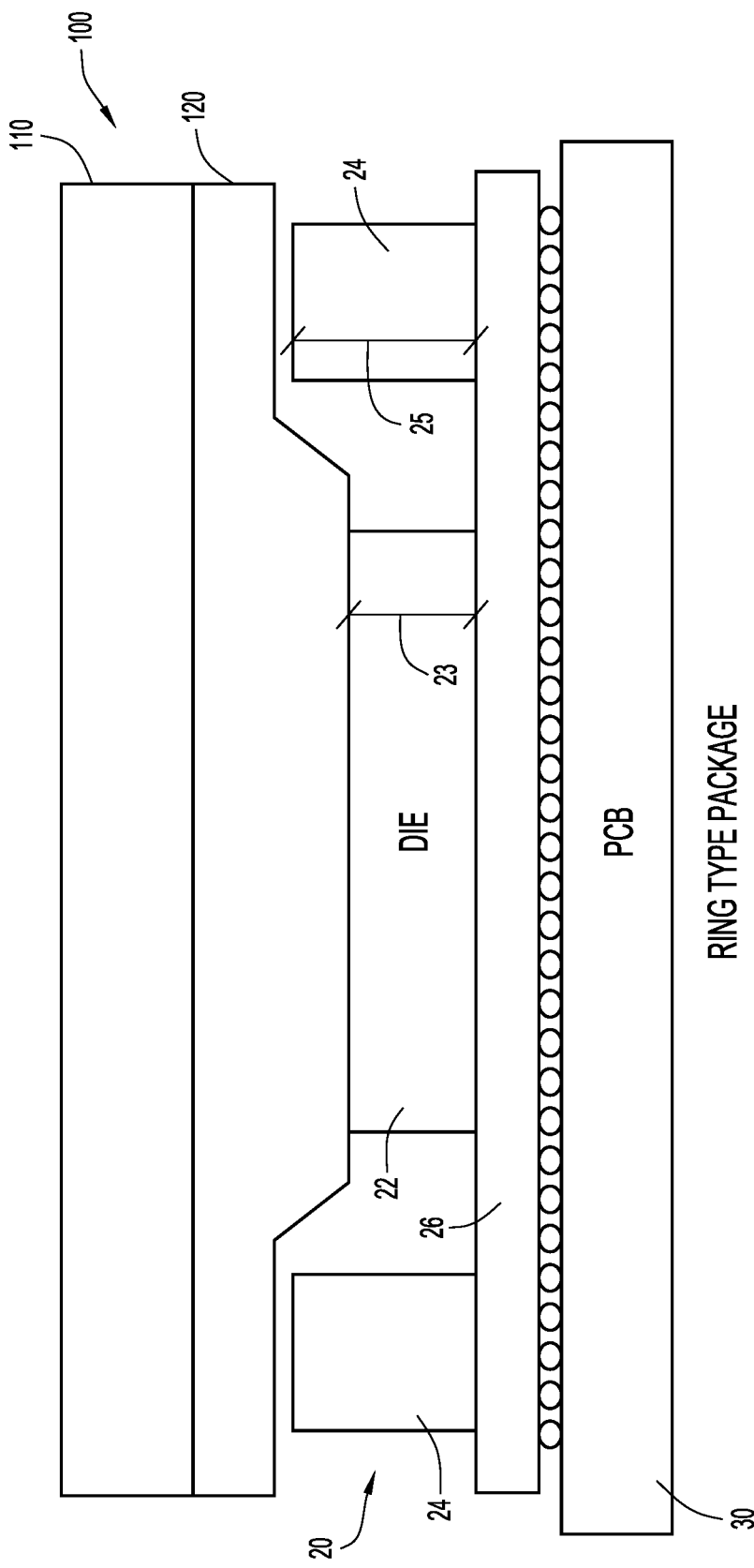
FIG. 2 is a front view of a cold plate assembly of the cooling system of FIG. 1 coupled to a heat source.

With reference to made to FIG. 2, a front view of the cold plate assembly 100 thermally coupled to the heat source 20 disposed on the PCB 30 is illustrated. The heat source 20 comprises a die 22 having a first height 23 and a ring support 24 having a second height 25 disposed on a substrate 26. The first height 23 and the second height 25 are with respect to a top surface of the substrate 26. The die 22 comprises ASIC/CPU/processor/circuitry that generates heat during a computing/communication operation. The ring support 24 surrounds the die 22. The ring support 24 provides structural support to the heat source 20 to prevent warpage. The warpage may be caused by thermal expansion of the heat source 20 due to the heat generated by the die 22 during operation, and due to compressive forces applied to the heat source 20. For example, the cold plate assembly 100 may apply a mounting or compressive force to the die 22.

Conventional cold plates typically include a solid copper plate with a plurality of heat pipes extending therethrough. The copper plate may include a pedestal and/or a thermal interface material to thermally couple the plate to the die 22 while avoiding the ring support 24. Heat may then be conducted from the die 22 through the cold plate to the heat pipes. However, the conventional copper plate does not evenly distribute the heat to the heat pipes, negatively impacting cooling efficiency. Thus, the amount of heat received by each heat pipe is uneven, causing some heat pipes to have reached their maximum heat capacity while other heat pipes are cooler and otherwise available to conduct additional heat. However, due to the geometry and material of the cold plate (e.g., copper), the heat is not conducted to the cooler heat pipes and the temperature of the cold plate and/or die 22 may rise to an undesirable level due to the heat buildup.

Still referring to FIG. 2, the cold plate assembly 100, according to an embodiment, comprises a sub-plate 110 attached to a vapor chamber 120 that evenly distributes heat across the sub-plate 110. Thus, the heat flux through the cold plate assembly 100 is improved as compared to conventional cold plates. The sub-plate 110 includes a plurality of pipes for receiving a flow of cooling fluid. The vapor chamber 120 may have a pedestal profile to contact a substantially entire upper surface of the die 22 while avoiding contact with the ring support 24. The vapor chamber 120 evenly distributes heat generated from the die 22 to the sub-plate 110. In some implementations, a thermal interface material may be disposed between the vapor chamber 120 and the die 22.

Figure 3A:
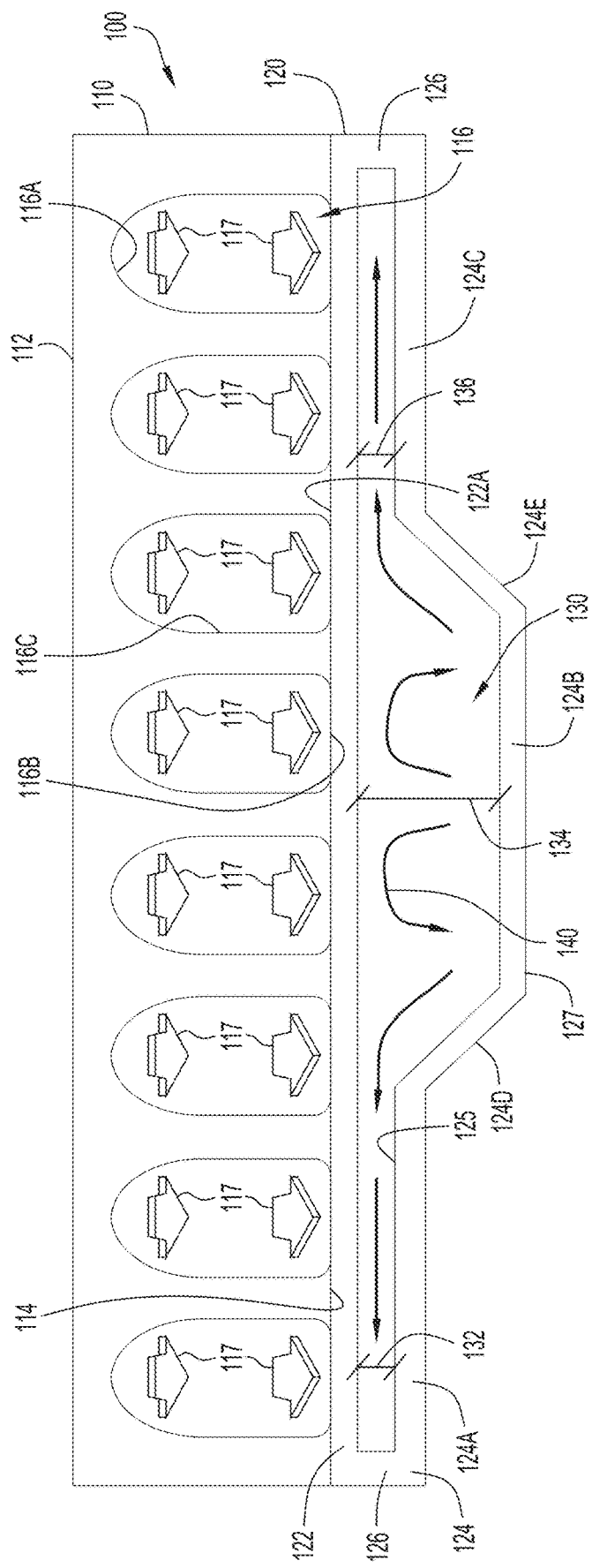
FIG. 3A is a cross-sectional view of the cold plate assembly of FIG. 2, according to an embodiment.

Now referring to FIG. 3A, a cross-sectional view of the sub-plate 110 and vapor chamber 120 of the cold plate assembly 100 are illustrated, according to an embodiment. The sub-plate 110 may comprise a rectangular or square plate having a top surface, or first surface 112, a bottom surface, or second surface 114, and a plurality of channels 116 disposed between the first and second surfaces 112 and 114. The plurality of channels 116 extend from the front end 102 to the back end 104 of the cold plate assembly 100, as depicted in FIG. 1. The channels 116 are fluidly coupled to the conduits 210. The channels 116 may have a rounded surface 116A at an end adjacent to the first surface 112, a flat surface 116B at an end adjacent to the second surface 114, and transverse side surfaces 116C extending from the rounded surface 116A to the flat surface 116B. The rounded surface 116A, the flat surface 116B, and the side surfaces 116C of the channels 116 define a pipe for circulating cooling fluid (indicated by arrows 117) through the sub-plate 110. The rounded surface 116A may have a parabolic shape or profile.

The cross-sectional shape and location of the channels 116 adjacent to the vapor chamber 120 improves the heat flux through the cold plate assembly 100 as compared to conventional cold plates. The flat surface 116B increases the surface area of the end of the channel 116 adjacent to/in contact with the vapor chamber 120. Additionally, the amount of material between the vapor chamber 120 and the channel 116 is minimized to reduce thermal resistance due to the material of the sub-plate 110. Consequently, heat flux through sub-plate 110 to the channels 116 may be improved as compared to conventional cold plates.

In some implementations, the plurality of channels 116 may be disposed within the sub-plate 110, and proximal to the second surface 114. That is, the channels 116 may be formed in the sub-plate 110 between the first and second surfaces 112 and 114, and closer to the second surface 114 than to the first surface 112. In another implementation, the channels 116 may be defined by grooves extending into the sub-plate 110 through the second surface 114 and the vapor chamber 120. In other words, the rounded surfaces 116A and side surfaces 116C of the channels 116 may be defined by grooves in the sub-plate 110 and the flat surface 116B may be defined by a flat outer surface of the vapor chamber 120. For example, the sub-plate 110 and grooves may be formed by compression molding and finished with a flying-cut to render the second surface 114 substantially flat. The sub-plate 110 is then attached to the vapor chamber 120 such that the vapor chamber 120 defines a portion of the channel 116, e.g., flat surface 116B. Accordingly, the vapor chamber 120 is in direct thermal contact with the cooling fluid flowing through the channels 116. While the figures show eight channels disposed in the sub-plate 110, embodiments are not limited thereto. For example, the sub-plate 110 may include any number of channels 116. In some implementations, the channels 116 may be heat pipes.

Still referring to FIG. 3A, the vapor chamber 120 comprises a first wall 122, a second wall 124, and side walls 126 extending between the first wall 122 and second wall 124. The first wall 122 has a substantially flat outer surface 122A. The first wall 122, the second wall 124, and the side walls 126 define an interior cavity or chamber 130. The interior cavity 130 includes a working fluid 140 for transmitting and distributing heat from the second wall 124 to first wall 122. In some implementations, a wick may be disposed on an inner surface 125 of the second wall 124 for evenly distributing the working fluid 140 along an inner surface 125 of the second wall.

As shown in FIG. 3A, the vapor chamber 120 may have a non-uniform cross-section such that a thickness or depth of the interior cavity 130 varies along a width of a vapor chamber. That is, the interior cavity 130 may have a first portion having a first depth or thickness 132, a second portion having a second depth or thickness 134, and a third portion having a third depth or thickness 136. In the illustrated embodiment, the first and third depths 132 and 136 are substantially the same and less than the second depth 134. The depths 132, 134, 136 of the interior cavity 130 are defined by a distance between the substantially straight first wall 122 and the second wall 124.

The second wall 124 includes a first horizontal portion 124A, a second horizontal portion 124B, a third horizontal portion 124C, a first angled portion 124D, and a second angled portion 124E. The first and third horizontal portions 124A, 124C are disposed at the first and third depths 132, 136 below the first wall 122. The second horizontal portion 124B is disposed at the second depth 134 below the first wall 122. The first angled portion 124D extends obliquely from the first horizontal portion 124A at the first depth 132 to the second horizontal portion 124B at the second depth 134. The second angled portion 124E extends obliquely from the second horizontal portion 124B at the second depth 134 to the third horizontal portion 124C at the third depth 136. The depths 132, 134, 136, may be set based on the heights 23, 25 of the die 22 and ring support 24. Accordingly, the second wall 124 of vapor chamber 120 defines a pedestal profile that allows the vapor chamber 120 to thermally couple to the die 22 while avoiding contact with the ring support 24 (as depicted in FIG. 2).

During operation, the vapor chamber 120 transfers heat from the heat source (e.g., die 22 of FIG. 2) to the cooling fluid flowing through the channels 116 in the sub-plate 110. For example, an outer surface 127 of the second wall 124 contacts a heat source. Due to the contact, heat from the heat source is transferred to the second horizontal portion 124B of the second wall 124. As shown in FIG. 3A, the second horizontal portion 124B transfers the heat to working fluid 140. In response to receiving the heat, a portion of the working fluid 140 transitions from a liquid phase to a gas phase. The gas portion of the working fluid 140 rises and distributes the received heat substantially evenly along the first wall 122 of the vapor chamber 120. The working fluid 140 condenses back into a liquid in response to conducting the heat to the first wall 122, and the liquid returns to the inner surface 125 of the second wall 124 where the cycle repeats. The first wall 122 transfers the heat to the cooling fluid flowing through the plurality of channels 116. Consequently, heat from the heat source is substantially evenly distributed to the cooling fluid flowing through the plurality of channels 116. As heated, the cooling fluid flows from the plurality of channels 116 through the conduits 210 to the remote heatsink 200 to remove the heat from the cold plate assembly 100.

Figure 3B:
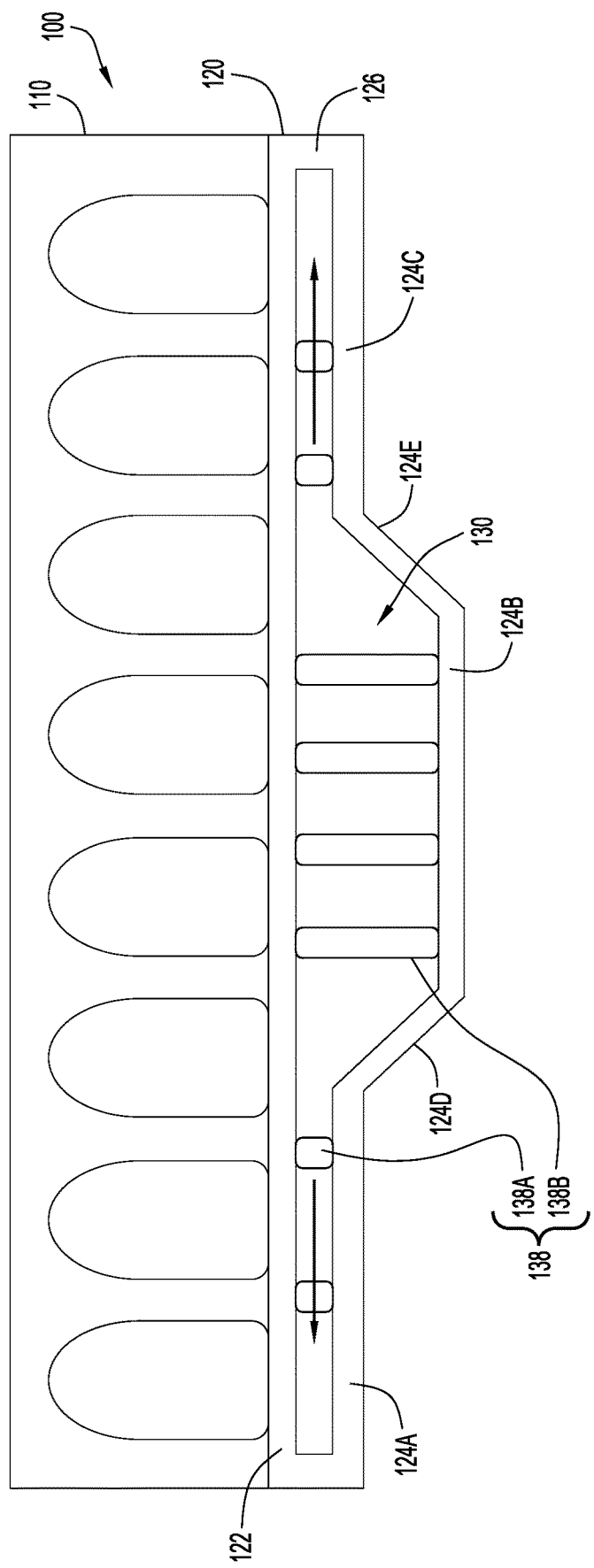
FIG. 3B is a cross-sectional view of the cold plate assembly of FIG. 2, according to another embodiment.

To thermally couple the vapor chamber 120 to the die 22, the cold plate assembly 100 applies a compressive force to the die 22. In some implementations, the vapor chamber 120 may include support structures to prevent the cavity 130 from collapsing due to the applied compressive force. In the example shown in FIG. 3B, the support structures comprise an array of pillars 138 extending between the first wall 122 and the second wall 124. The height of each pillar 138 is dependent on the depth of the second wall 124 at the location of the pillar 138. For example, the pillars 138A disposed at the first horizontal portion 124A are shorter than the pillars 138B disposed at the second horizontal portion 124B. The number and diameter of the pillars 138 used may be based on the amount of force applied by the cold plate assembly 100 to the die 22. The array of pillars 138 does not interfere with the heat transferring capabilities of vapor chamber 120, and in some implementations, may improve heat flux through the vapor chamber 120, as compared to a vapor chamber without pillars 138. Additionally, or alternatively, the side walls 122, 124, 126 of the vapor chamber 120 may be reinforced to withstand the applied force. For example, a thickness of the side walls 122, 124, 126 may be based on the amount of force to be applied by the cold plate assembly 100 to the die 22.

Figure 4A:
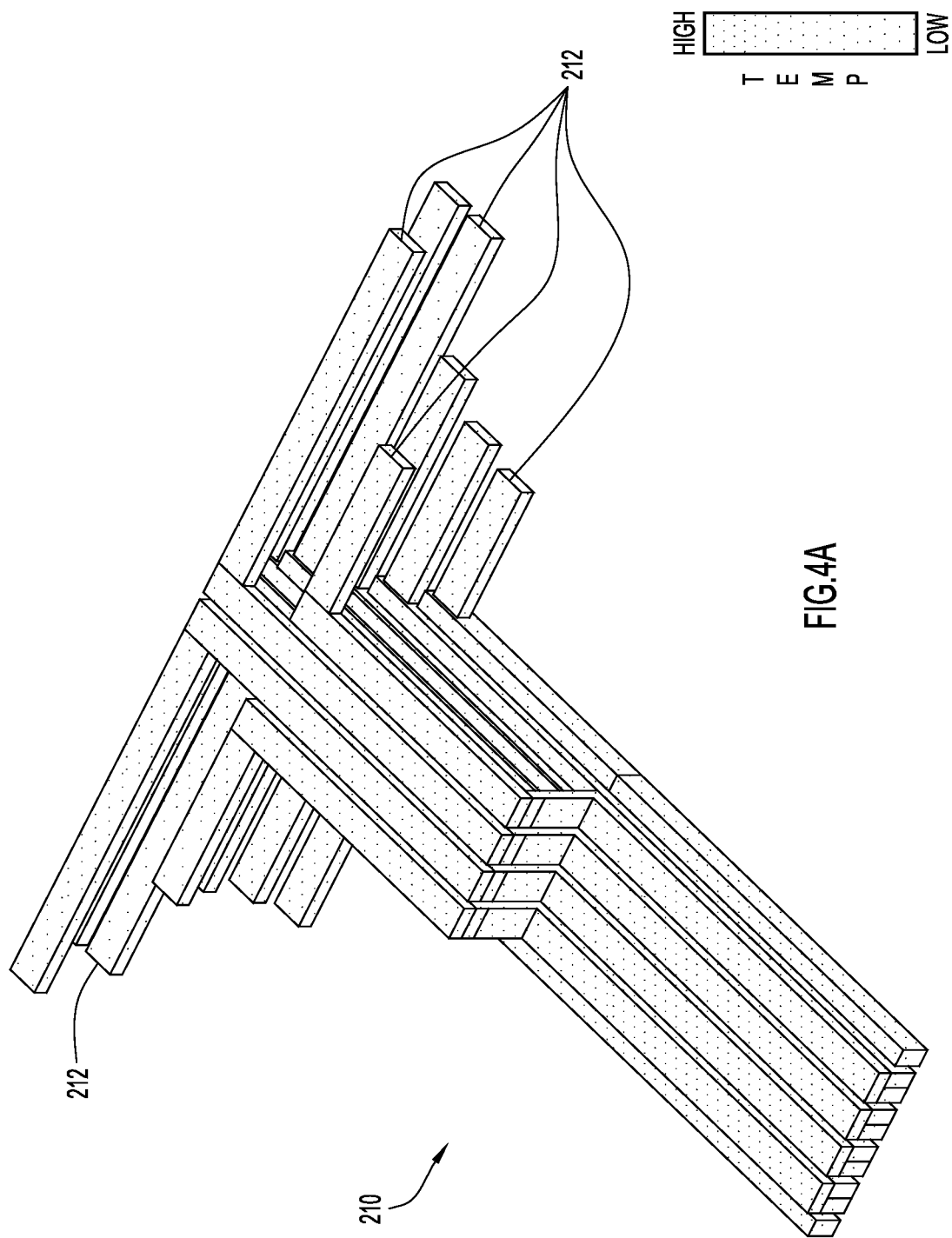
FIG. 4A is a perspective view of conduits of the cooling system of FIG. 1 without the cold plate and remote heatsink.
Figure 4B:
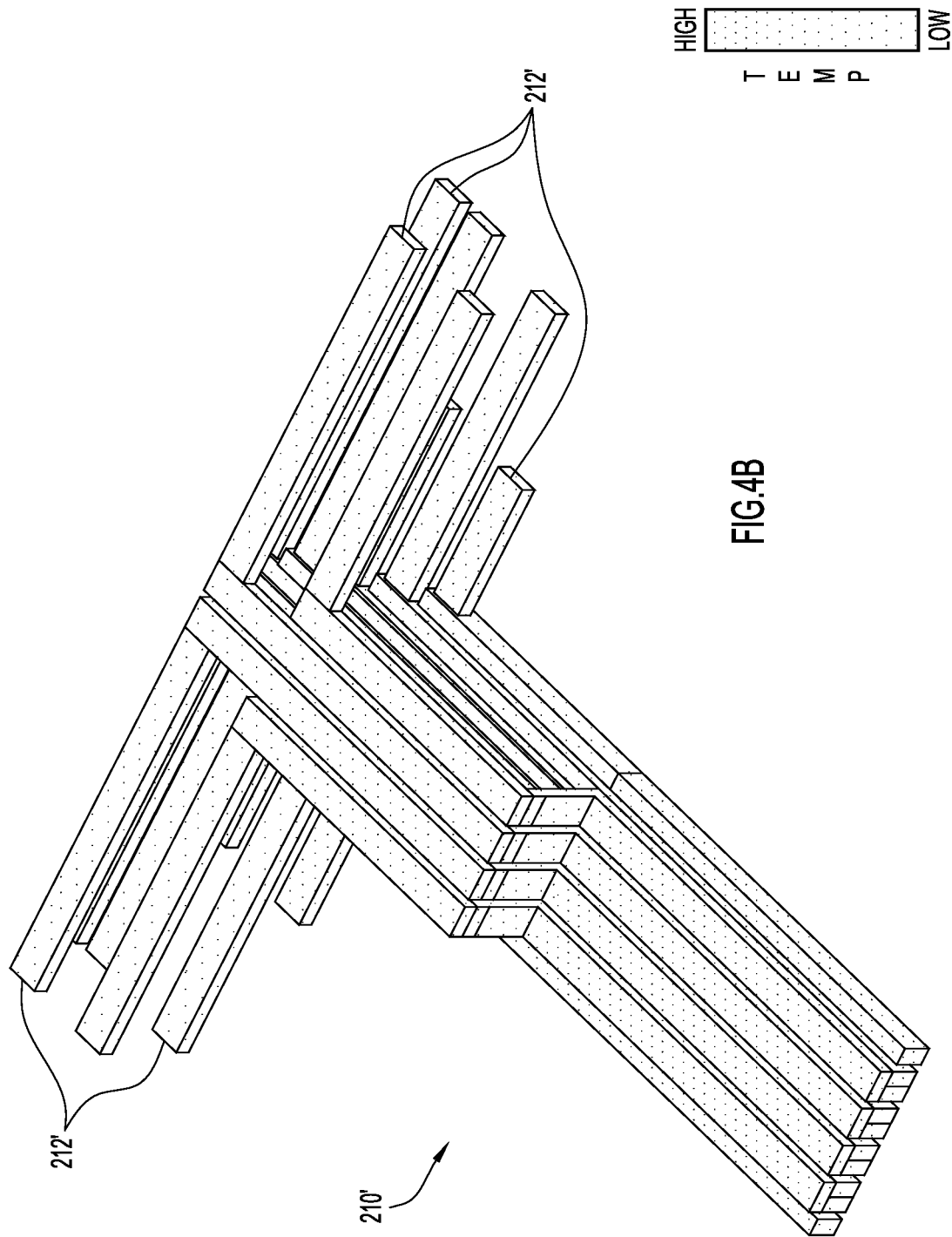
FIG. 4B is a perspective view of conduits of the cooling system of FIG. 1 without the cold plate and remote heatsink, according to another embodiment.

Reference is now made to FIGS. 4A and 4B, also with reference to FIG. 1. FIGS. 4A and 4B illustrate the use of conduits 210 and 210', respectively, according to example embodiments. For clarity, the cold plate assembly 100 and remote heatsink 200 are not shown in FIGS. 4A and 4B. The conduits 210 and 210' are fluidly coupled to the channels 116 at the back end 104 of the cold plate assembly 100, and extend into the remote heatsink 200 and towards the lateral ends 202 and 204. As shown in FIGS. 4A and 4B, the total length of each of the conduits 210 and 210' is individually selected such that temperatures of the cooling fluid at the distal ends 212 and 212' of conduits 210 and 210', respectively, are within ten (10) degrees Celsius of each other. In some implementations, the temperatures of the cooling fluid at the distal ends 212 and 212' of each conduit 210 and 210' are within five (5) degrees Celsius of each other. Consequently, the heat is substantially evenly distributed through the remote heatsink 200 providing improved heat flux through the conduits 210 and 210'. Accordingly, the varied lengths of the conduits 210 and 210' improve cooling efficiency of the remote heatsink 200 as compared to conduits with substantially the same lengths.

According to an example embodiment, a cold plate assembly includes a sub-plate having a first surface, a second surface, and a plurality of pipes; and a vapor chamber having a first wall and a second wall opposite the first wall. The first wall and the second wall define an interior cavity having a first depth for one or more first portions of the vapor chamber and a second depth for one or more second portions of the vapor chamber. The second surface of the sub-plate is attached to the first wall of the vapor chamber.

In one form of the cold plate assembly, the second wall includes a first horizontal portion parallel to the first wall, a first angled portion oblique to the first horizontal portion, a second horizontal portion, a second angled portion oblique to the second horizontal portion, and a third horizontal portion. The first and second angled portions and the second horizontal portion may define a pedestal profile for the vapor chamber. The plurality of pipes may include a rounded surface proximal to the first surface and a substantially flat surface defined by the first wall of the vapor chamber.

In one form of the cold plate assembly, the vapor chamber further includes a wick disposed along an inner surface of the second wall.

In one form of the cold plate assembly, wherein the plurality of pipes are configured to receive a cooling fluid.

According to another example embodiment, a system for cooling a heat source, includes a heatsink disposed remotely from the heat source, a cold plate assembly, and conduits fluidly coupling the heatsink to the cold plate assembly. The cold plate assembly includes a sub-plate having a first surface, a second surface, and a plurality of heat pipes and a vapor chamber having a first wall and a second wall opposite the first wall. The first wall and the second wall define an interior cavity having a first depth for one or more first portions and a second depth for one or more second portions. The first wall is attached to the second surface of the sub-plate.

In one form of the system, each pipe of the plurality of heat pipes includes a rounded surface proximal to the first surface.

In one form of the system, the sub-plate and the first wall of the vapor chamber define the plurality of heat pipes fluidly coupled to the conduits. The heat pipes may include a rounded surface proximal to the first surface and a substantially flat surface defined by the first wall. The vapor chamber may further include a working fluid configured to transition between a liquid phase and a gas phase when heated. When a portion of the working fluid is in the gas phase, the portion of the working fluid evenly distributes along the first wall of the vapor chamber.

In one form of the system, a thickness of the interior cavity varies along a width of the vapor chamber.

In one form of the system, lengths of the conduits are configured to set temperatures of a cooling fluid at distal ends of the conduits within ten degrees Celsius of each other.

In one form of the system, the vapor chamber is thermally coupled to the heat source. The heat source may be a chip disposed on a printed circuit board, the chip may have a first height and may be surrounded by a ring support having a second height greater than the first height.

In one form of the system, the vapor chamber further includes a plurality of support pillars traversing the interior cavity to support a predetermined compressive force. A thickness of one or more walls of the vapor chamber, including the first and second walls, may be configured to support the predetermined compressive force.

In yet another example embodiment, a cold plate assembly includes a sub-plate having a first surface, a second surface, and a plurality of rounded grooves disposed in the second surface, and a vapor chamber having a first wall having a flat surface and a second wall opposite the first wall, the first wall and second wall defining an interior cavity. The second surface is bonded to the flat surface.

In one form of the cold plate assembly, the plurality of rounded grooves and the flat surface of the vapor chamber define a plurality of heat pipes configured to receive a cooling fluid. Each heat pipe of the plurality of heat pipes have a rounded end proximal to the first surface and a flat end opposite the rounded end. The flat end defined by the flat surface of the vapor chamber.

In one form of the cold plate assembly, the plurality of rounded grooves have a substantially parabolic shape.

In one form of the cold plate assembly, the interior cavity of the vapor chamber includes a first thickness and a second thickness.

The above description is intended by way of example only. Although the techniques are illustrated and described herein as embodied in one or more specific examples, it is nevertheless not intended to be limited to the details shown, since various modifications and structural changes may be made within the scope and range of equivalents of the claims.

Reference may be made to the spatial relationships between various components and to the spatial orientation of various aspects of components as depicted in the attached drawings. However, as will be recognized by those skilled in the art after a complete reading of the present disclosure, the devices, components, members, apparatuses, etc. described herein may be positioned in any desired orientation. Thus, the use of terms such as 'above', 'below', 'upper', 'lower', 'top', 'bottom', or other similar terms to describe a spatial relationship between various components or to describe the spatial orientation of aspects of such components, should be understood to describe a relative relationship between the components or a spatial orientation of aspects of such components, respectively, as the components described herein may be oriented in any desired direction. When used to describe a range of dimensions and/or other characteristics (e.g., time, pressure, temperature, distance, etc.) of an element, operations, conditions, etc. the phrase 'between X and Y' represents a range that includes X and Y.

For example, it is to be understood that terms such as "left," "right," "top," "bottom," "front," "rear," "side," "height," "length," "width," "upper," "lower," "interior," "exterior," "inner," "outer" and the like as may be used herein, merely describe points of reference and do not limit the present embodiments to any particular orientation or configuration. Further, the term "exemplary" is used herein to describe an example or illustration. Any embodiment described herein as exemplary is not to be construed as a preferred or advantageous embodiment, but rather as one example or illustration of a possible embodiment.

Further, the present disclosure may repeat reference numerals and/or letters in the various examples. This repetition is for the purpose of simplicity and clarity and does not in itself dictate a relationship between the various embodiments and/or configurations discussed. Example embodiments that may be used to implement the features and functionality of this disclosure will now be described with more particular reference to the accompanying figures.

Similarly, when used herein, the term "comprises" and its derivations (such as "comprising", etc.) should not be understood in an excluding sense, that is, these terms should not be interpreted as excluding the possibility that what is described and defined may include further elements, steps, etc. Meanwhile, when used herein, the term "approximately" and terms of its family (such as "approximate", etc.) should be understood as indicating values very near to those which accompany the aforementioned term. That is to say, a deviation within reasonable limits from an exact value should be accepted, because a skilled person in the art will understand that such a deviation from the values indicated is inevitable due to measurement inaccuracies, etc. The same applies to the terms "about" and "around" and "substantially".

As used herein, unless expressly stated to the contrary, use of the phrase 'at least one of', 'one or more of', 'and/or', variations thereof, or the like are open-ended expressions that are both conjunctive and disjunctive in operation for any and all possible combination of the associated listed items. For example, each of the expressions 'at least one of X, Y and Z', 'at least one of X, Y or Z', 'one or more of X, Y and Z', 'one or more of X, Y or Z' and 'X, Y and/or Z' can mean any of the following: 1) X, but not Y and not Z; 2) Y, but not X and not Z; 3) Z, but not X and not Y; 4) X and Y, but not Z; 5) X and Z, but not Y; 6) Y and Z, but not X; or 7) X, Y, and Z.

Additionally, unless expressly stated to the contrary, the terms 'first', 'second', 'third', etc., are intended to distinguish the particular nouns they modify (e.g., element, condition, node, module, activity, operation, etc.). Unless expressly stated to the contrary, the use of these terms is not intended to indicate any type of order, rank, importance, temporal sequence, or hierarchy of the modified noun. For example, 'first X' and 'second X' are intended to designate two 'X' elements that are not necessarily limited by any order, rank, importance, temporal sequence, or hierarchy of the two elements. Further as referred to herein, 'at least one of' and 'one or more of' can be represented using the '(s)' nomenclature (e.g., one or more element(s)).

One or more advantages described herein are not meant to suggest that any one of the embodiments described herein necessarily provides all of the described advantages or that all the embodiments of the present disclosure necessarily provide any one of the described advantages. Numerous other changes, substitutions, variations, alterations, and/or modifications may be ascertained to one skilled in the art and it is intended that the present disclosure encompass all such changes, substitutions, variations, alterations, and/or modifications as falling within the scope of the appended claims.

What is claimed is:

1. A cold plate assembly comprising:
  a sub-plate comprising a first surface, a second surface, and a plurality of channels disposed between the first surface and the second surface, the plurality of channels configured to receive a cooling fluid such that at least a portion of second surface contacts the cooling fluid; and
  a vapor chamber having a first wall and a second wall opposite the first wall, the first wall and the second wall defining an interior cavity having a first depth for one or more first portions of the vapor chamber and a second depth for one or more second portions of the vapor chamber,
  wherein the second surface of the sub-plate is attached to the first wall of the vapor chamber and the cooling fluid contacts the first wall of the vapor chamber.

2. The cold plate assembly of claim 1, wherein the second wall comprises a first horizontal portion parallel to the first wall, a first angled portion oblique to the first horizontal portion, a second horizontal portion, a second angled portion oblique to the second horizontal portion, and a third horizontal portion.

3. The cold plate assembly of claim 2, wherein the first and second angled portions and the second horizontal portion define a pedestal profile for the vapor chamber.

4. The cold plate assembly of claim 3, further comprising a plurality of pipes that have a rounded surface proximal to the first surface and a substantially flat surface adjacent to the vapor chamber.

5. The cold plate assembly of claim 1, wherein the vapor chamber further comprises a wick disposed along an inner surface of the second wall.

6. The cold plate assembly of claim 1, wherein the first wall of the vapor chamber further comprises a substantially flat surface bonded to the second surface of the sub-plate, and further comprising a plurality of pipes defined by the flat surface of the first wall.

7. A system for cooling a heat source, comprising:
  a heatsink disposed remotely from the heat source;
  a cold plate assembly comprising:
    a sub-plate having a first surface, a second surface, and a plurality of heat pipes; and
    a vapor chamber having a first wall and a second wall opposite the first wall, the first wall and the second wall defining an interior cavity having a first depth for one or more first portions and a second depth for one or more second portions, wherein the first wall is attached to the second surface of the sub-plate; and conduits fluidly coupling the heatsink to the cold plate assembly, wherein lengths of the conduits are configured to set temperatures of a cooling fluid at distal ends of the conduits within ten degrees Celsius of each other.

8. The system of claim 7, wherein each pipe of the plurality of heat pipes comprises a rounded surface proximal to the first surface.

9. The system of claim 7, wherein the sub-plate and the first wall of the vapor chamber define the plurality of heat pipes fluidly coupled to the conduits.

10. The system of claim 9, wherein the heat pipes comprise a rounded surface proximal to the first surface and a substantially flat surface defined by the first wall.

11. The system of claim 9, wherein the vapor chamber further comprises a working fluid configured to transition between a liquid phase and a gas phase when heated, wherein when a portion of the working fluid is in the gas phase, the portion of the working fluid evenly distributes along the first wall of the vapor chamber.

12. The system of claim 7, wherein a thickness of the interior cavity varies along a width of the vapor chamber.

13. The system of claim 7, wherein the vapor chamber is thermally coupled to the heat source.

14. The system of claim 13, wherein the heat source is a chip disposed on a printed circuit board, the chip has a first height and is surrounded by a ring support having a second height greater than the first height.

15. The system of claim 7, wherein the vapor chamber further comprises a plurality of support pillars traversing the interior cavity to support a predetermined compressive force; and/or a thickness of one or more walls of the vapor chamber, including the first and second walls, is configured to support the predetermined compressive force.

16. A cold plate assembly comprising:

a sub-plate comprising a first surface, a second surface, and a plurality of rounded grooves disposed in the second surface; and a vapor chamber having a first wall having a flat surface and a second wall opposite the first wall, the first wall and second wall defining an interior cavity, wherein the second surface is bonded to the flat surface, and wherein the plurality of rounded grooves and the flat surface of the vapor chamber are configured to receive a cooling fluid such that at least a portion of the second surface and the flat surface of the vapor chamber contact the cooling fluid.

17. The cold plate assembly of claim 16, further comprising a plurality of heat pipes extending from the sub-plate and which have a rounded end proximal to the first surface and a flat end opposite the rounded end.

18. The cold plate assembly of claim 16, wherein the plurality of rounded grooves have a substantially parabolic shape.

19. The cold plate assembly of claim 16, wherein the interior cavity of the vapor chamber comprises a first thickness and a second thickness.

20. The cold plate assembly of claim 16, further comprising a plurality of heat pipes configured to fluidly couple to and receive cooling fluid from conduits extending from a remote heatsink.

* * * * *

UNITED STATES PATENT AND TRADEMARK OFFICE
CERTIFICATE OF CORRECTION

| | |
|---|---|
| PATENT NO. | : 11,758,689 B2 |
| APPLICATION NO. | : 17/242722 |
| DATED | : September 12, 2023 |
| INVENTOR(S) | : Yaotsan Tsai et al. |

It is certified that error appears in the above-identified patent and that said Letters Patent is hereby corrected as shown below:

In the Claims

Claim 1, Column 8, Line 28, please replace "a portion of second surface contacts the cooling fluid;" with --a portion of the second surface contacts the cooling fluid;--

Signed and Sealed this
Seventh Day of November, 2023

Katherine Kelly Vidal
*Director of the United States Patent and Trademark Office*